United States Patent
Laurila et al.

(10) Patent No.: US 7,059,390 B2
(45) Date of Patent: Jun. 13, 2006

(54) COOLING ELEMENT

(75) Inventors: Risto Laurila, Espoo (FI); Jukka Sikanen, Espoo (FI); Erkki Ukkola, Helsinki (FI)

(73) Assignee: ABB OY, Helsinki (FI)

(*) Notice: Subject to any disclaimer, the term of this patent is extended or adjusted under 35 U.S.C. 154(b) by 0 days.

(21) Appl. No.: 11/120,192

(22) Filed: May 3, 2005

(65) Prior Publication Data
US 2005/0274505 A1    Dec. 15, 2005

(30) Foreign Application Priority Data
Jun. 11, 2004   (FI) .................................. 20045216

(51) Int. Cl.
*H05K 7/20* (2006.01)
(52) U.S. Cl. ..................... 165/80.4; 165/139; 165/168
(58) Field of Classification Search .............. 165/80.4, 165/139, 168
See application file for complete search history.

(56) References Cited

U.S. PATENT DOCUMENTS

| | | | | |
|---|---|---|---|---|
| 1,905,653 A | * | 4/1933 | Schranz | 165/168 |
| 3,282,335 A | * | 11/1966 | Pierre | 165/183 |
| 3,327,776 A | * | 6/1967 | Butt | 165/80.4 |
| 3,437,132 A | * | 4/1969 | William | 165/80.4 |
| 3,887,004 A | * | 6/1975 | Beck | 165/179 |
| 4,079,410 A | * | 3/1978 | Schierz | 257/714 |
| 4,268,850 A | * | 5/1981 | Lazarek et al. | 257/714 |
| 4,712,158 A | | 12/1987 | Kikuchi et al. | |
| 5,098,514 A | * | 3/1992 | Held | 156/583.1 |
| 5,636,684 A | * | 6/1997 | Teytu et al. | 165/80.4 |
| 5,957,194 A | | 9/1999 | Azar | |
| 6,058,010 A | * | 5/2000 | Schmidt et al. | 361/689 |
| 6,305,180 B1 | | 10/2001 | Miller et al. | |
| 6,615,911 B1 | * | 9/2003 | Bhatti et al. | 165/80.4 |
| 6,796,372 B1 | * | 9/2004 | Bear | 165/104.21 |
| 2004/0066629 A1 | | 4/2004 | Balszunat et al. | |

FOREIGN PATENT DOCUMENTS

EP       1056323      11/2000

* cited by examiner

*Primary Examiner*—Allen J. Flanigan
(74) *Attorney, Agent, or Firm*—Dykema Gossett PLLC

(57) ABSTRACT

The present invention relates to a cooling element of an electronic device, comprising: an inlet opening, and outlet opening, and a flow channel. To achieve efficient cooling with as low costs as possible, the flow channel is designed to cause a pressure difference between the forward end and tail end of the flow channel. At the higher-pressure forward end, an inlet opening is arranged for a secondary cycle. At the lower-pressure tail end of the cooling element flow channel, an outlet opening is arranged for said secondary cycle.

6 Claims, 2 Drawing Sheets

COOLING ELEMENT

FIELD OF THE INVENTION

The present invention relates to a cooling element of an electronic device, through the flow channel of which cooling fluid is fed to conduct away any superfluous heat generated by the electronic device.

DESCRIPTION OF THE PRIOR ART

To provide efficient cooling for an electronic device, it is often necessary to cool several points of the same device. To do this, separate branches, control valves, and other accessories are used with known cooling elements to make cooling fluid circulate to a sufficient extent to the cooling elements located at different points of the electronic device. However, using several separate parts makes the structure unnecessarily complex and also causes additional costs. Especially in serial production, it is naturally desirable to achieve an as simple structure as possible, in which the costs of a single apparatus remain as low as possible.

SUMMARY OF THE INVENTION

It is an object of the present invention to solve the problem described above and to provide a cooling element of an electronic apparatus that permits efficient cooling in an as simple and as efficient manner as possible. This object is achieved by a cooling element according to independent claim 1.

The invention utilizes a cooling element, in the flow channel of which a pressure difference is provided between the forward and tail end. This way, it is possible to branch off from the flow channel of the cooling element a secondary cycle between an inlet opening and outlet opening that are in different pressure areas, and through the secondary cycle, cooling fluid can be led to a second cooling point. The secondary cycle can thus be provided directly from the cooling element without requiring separate branchtees or valves in the structure. Thus, the manufacturing costs can be minimized.

Preferred embodiments of the cooling element of the invention are set forth in the attached dependent claims 2 to 6.

BRIEF DESCRIPTION OF THE FIGURES

In the following, the invention will be described in greater detail by way of example with reference to the attached figures, in which.

DESCRIPTION OF THE PREFERRED EMBODIMENTS

Figure 1:
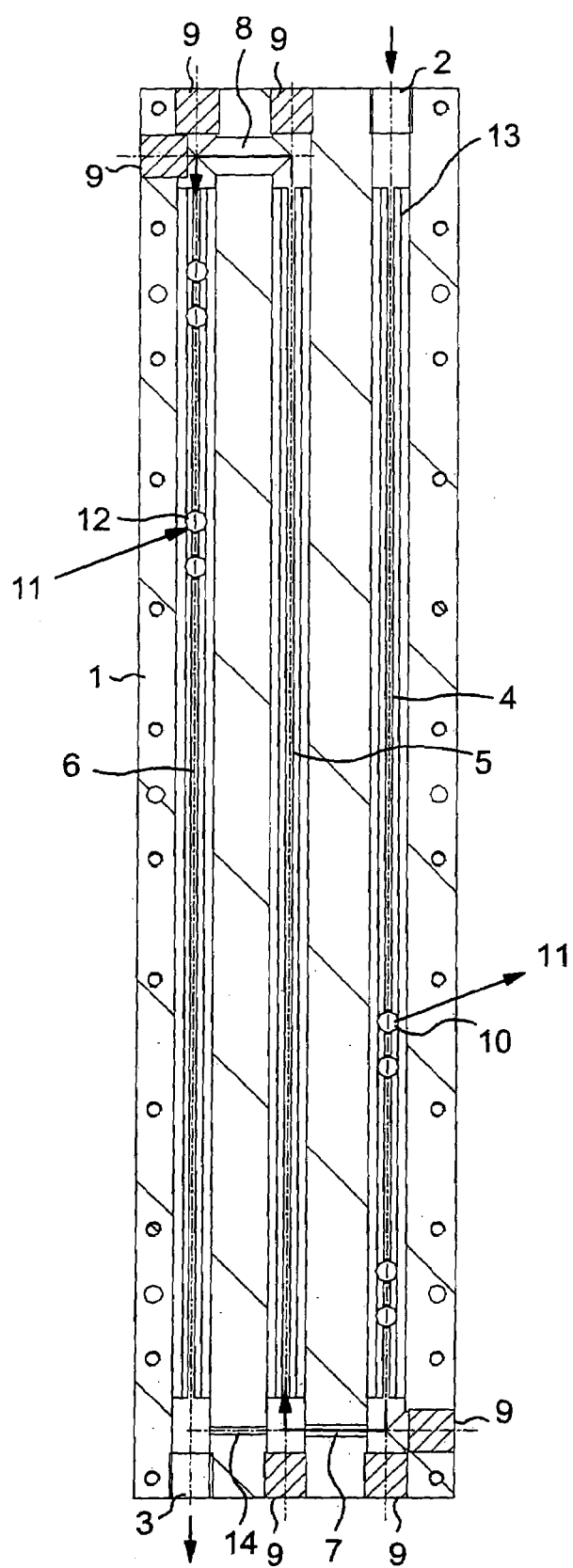
FIG. 1 is a sectional view of the cooling element of the invention.
Figure 2:
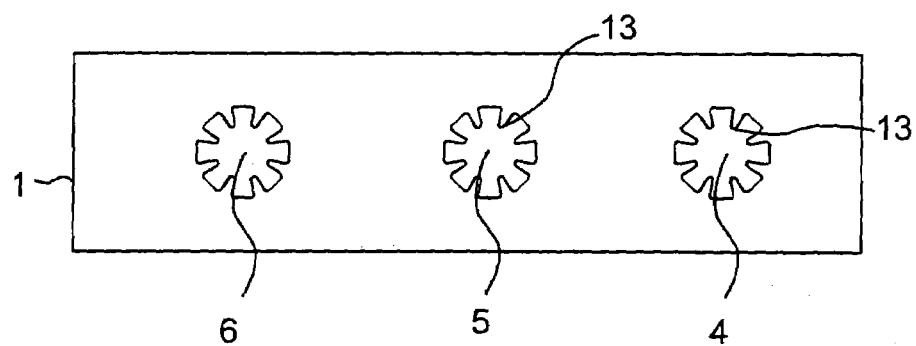
FIG. 2 shows the cooling fins of the channels in the cooling element.

FIGS. 1 and 2 illustrate a preferred embodiment of a cooling element 1 of an electronic device of the invention. In FIG. 1, the flow of cooling fluid, i.e. in practice the cooling liquid, between an inlet opening 2 and outlet opening 3 is illustrated with arrows. The cooling element has a flow channel that is designed to wind back and forth in such a manner that, in the case of the figures, the cooling element comprises three substantially parallel channel sections 4, 5, and 6. The channel sections are arranged to cover substantially the entire surface area of the cooling element in such a manner that the temperature of the outer surface of the cooling element in contact with the electronic device remains constant.

The flow channel of the cooling element 1 is designed to generate a pressure difference between the forward end and tail end of the flow channel. In the example of FIG. 1, the pressure difference is obtained by dimensioning a channel 7 connecting the channel sections 4 and 5 of the flow channel in such a manner that its cross-section is smaller than the cross-section of the flow channel in other parts of the flow channel. The desired pressure difference can be produced during manufacturing by suitably dimensioning the cross-section of the channel 7. In the case of FIG. 1, the cross-section of a channel 8 connecting the channel sections 5 and 6 corresponds substantially to the cross-section of the channel sections 5 and 6. However, if a pressure difference is also needed between these channel sections, it can be done by making the cross-section of channel 8 smaller.

The cooling element shown in the figures is made into one uniform piece by extruding aluminum. This way, the channel sections 4, 5, and 6 are already produced in the extrusion step. The other channels 7, 8, and 14 are made by drilling, after which the superfluous openings in the outer surface of the cooling element 1 are plugged with stoppers 9, such as screw plugs or stop plugs mounted with an interference fit. To minimize the plugging, the channels 7 and 14 are arranged coaxial, whereby they can be provided through the same drill hole.

An inlet opening 10 for a secondary cycle 11 is arranged at the higher-pressure end of the flow channel of the cooling element 1. In the channel section 4, there are four of these inlet openings, whereby the cooling element 1 of FIG. 1 can provide cooling fluid input for a maximum of four separate secondary cycles. In practice, the inlet opening 10 of the channel section 4 can be connected with a tube or pipe to an inlet opening of a second cooling element, whereby this second cooling element can cool a component that is at a distance from the cooling element 1 shown in FIG. 1.

An outlet opening 12 from the above-mentioned secondary cycle is arranged at the lower-pressure tail end of the flow channel of the cooling element 1. In practice, this outlet opening 12 can be connected with a tube or pipe to the outlet opening of the above-mentioned second cooling element, whereby cooling fluid cycle of the second cooling element is in its entirety directed through the cooling element 1. This eliminates the need to use separate connectors and/or valves in providing the secondary cycle 11.

The cooling fluid quantity that exits to the secondary cycle depends for instance on the pressure difference between the inlet opening 10 and the outlet opening 12. Thus, by dimensioning in different ways the choke point affecting this pressure difference, i.e. the smaller-diameter channel 7, it is possible to affect the efficiency of the cooling in the secondary cycle.

In FIGS. 1 and 2, the cooling element flow channel has fins 13 on the inner surfaces of the channel sections 4, 5, and 6. These fins located longitudinally on the inner surface of the flow channel are shown clearest in FIG. 2, which is an end view of the cooling element of FIG. 1 prior to mounting the plugs 9. Due to the fins, the surface area of the inner surfaces increases, whereby heat is more efficiently transmitted to from the cooling element to cooling fluid.

Differing from FIG. 1, the fins 13 can be cut at regular intervals in such a manner that along the length of the channel sections 4, 5, and 6, there are not continuously extending fins. This provides the advantage that heat transmission from the cooling element 1 to cooling fluid is further improved, because after the cut point, the boundary layer of the flow is broken and begins to re-develop.

The cooling element 1 is also equipped with a discharge channel 14 that enables the discharge of cooling fluid from the flow channel of the cooling element. When the cooling element is mounted upright in such a manner that its inlet opening 2 opens upwards and its outlet opening 3 downwards, the discharge of cooling fluid takes place by gravity through the outlet opening 3. Namely, cooling fluid then exits the channel section 4 through the smaller-diameter channel 7 to the channel section 5, and flows on from the channel section 5 through the discharge channel 14 to the channel section 6, and out through the outlet opening 3. The discharge channel 14 is preferably dimensioned in such a manner that its cross-section is clearly smaller than the cross-section of the channel sections 5, 6, and 8. Thus, during the use of the cooling element 1, there is hardly any pressure difference between the ends of the discharge channel 14, and consequently, hardly any cooling fluid flows through the discharge channel 14.

A full and easy emptying of the cooling element is advantageous, because among other things, it permits cold-storage of the element. Without the emptying option, a once filled cooling element may be damaged, if cooling fluid freezes. With the cooling element of FIG. 1, this danger does not exist, and the cooling element can be test-run with water, for instance, during manufacturing and then fully emptied before storage and delivery to customer.

It should be understood that the above description and the related figures are only intended to illustrate the present invention. Different variations and modifications will be apparent to a person skilled in the art without departing from the scope of the invention.

The invention claimed is:

1. A cooling element of an electronic device, comprising:
   an inlet opening for receiving cooling fluid,
   an outlet opening for discharging cooling fluid from the cooling element, and
   a flow channel for directing cooling fluid from the cooling element inlet opening to the outlet opening, wherein
   the flow channel comprises a section with a smaller cross-section as compared to the cross-section of other parts of the flow channel in order to generate a pressure difference between a forward end and a tail end of the flow channel,
   at the higher-pressure forward end of the cooling element flow channel and before said section with a smaller cross-section in the direction of flow, an inlet opening is arranged for a secondary cycle, from which cooling fluid is directed to a secondary cycle that is external to the cooling element, and
   at the lower-pressure tail end of the cooling element flow channel and after said section with a smaller cross-section in the direction of flow, an outlet opening is arranged for said secondary cycle, from which cooling fluid returning from the secondary cycle is directed to the flow channel of the cooling element.

2. The cooling element as claimed in claim 1, wherein the inner surface of the flow channel has longitudinal fins protruding from the walls of the flow channel to increase the surface area of the inner surface.

3. The cooling element as claimed in claim 2, wherein the fins are cut at regular intervals in the longitudinal direction of the flow channel.

4. The cooling element as claimed in claim 1, wherein the flow channel is shaped to wind back and forth, whereby the flow channel has several channel sections substantially parallel to each other, and
   between at least two substantially parallel channel sections, a discharge channel is formed, having a substantially smaller cross-section than that of the flow channel, and having one end that opens in the vicinity of the inlet or outlet opening of he flow channel to enable the emptying of the flow channel.

5. The cooling element as claimed in claim 1, wherein said cooling element is formed of a uniform piece, to which a flow channel is made by extrusion and/or drilling.

6. A cooling equipment of an electronic device comprising:
   a first and second cooling element,
   said first cooling element comprising:
   an inlet opening for receiving cooling fluid,
   an outlet opening for discharging cooling fluid from the first cooling element, and
   a flow channel for directing cooling fluid from the first cooling element inlet opening to the outlet opening, wherein
   the flow channel is shaped to generate a pressure difference between a forward end and a tail end of the flow channel,
   at the higher-pressure forward end of the first cooling element flow channel, an inlet opening is arranged for a secondary cycle, said inlet opening for the secondary cycle being connected to said second cooling element for directing cooling fluid to said second cooling element that is external from the first cooling element, and
   at the lower-pressure tail end of the first cooling element flow channel, an outlet opening is arranged for said secondary cycle, said outlet opening for the secondary cycle being connected to said second cooling element for receiving cooling fluid returning from the second cooling element.

* * * * *